Figure 1:
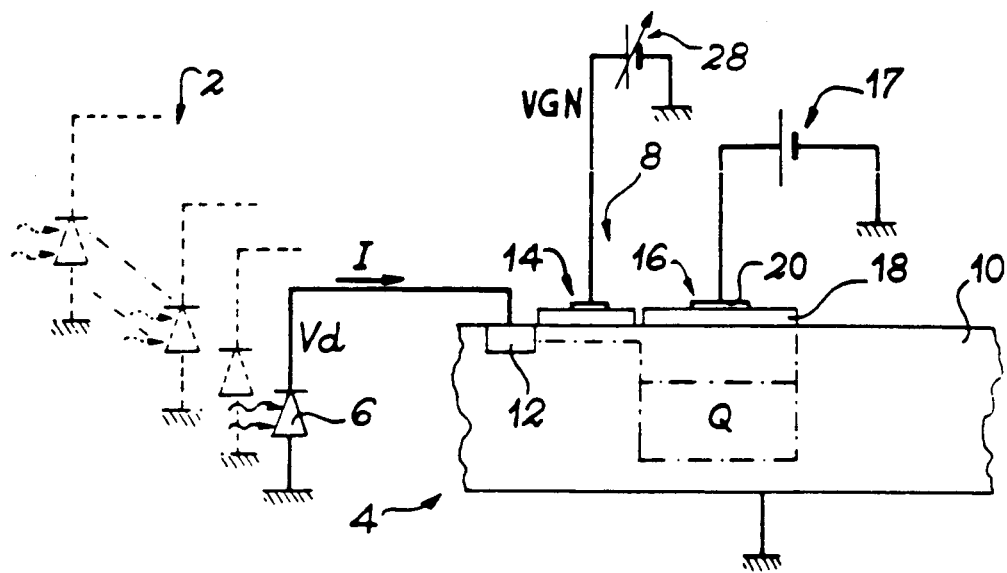

United States Patent [19]

Nicolas et al.

[11] Patent Number: 5,008,544
[45] Date of Patent: Apr. 16, 1991

[54] SYSTEM FOR THE DETECTION OF INFORMATION IN THE FORM OF ELECTROMAGNETIC RADIATION AND READING THE DETECTED INFORMATION

[75] Inventors: Pierre Nicolas, Saint Egreve; Philippe Pantigny, Grenoble, both of France

[73] Assignee: Commissariat a l'Energie Atomique, Paris, France

[21] Appl. No.: 382,427

[22] Filed: Jul. 19, 1989

[30] Foreign Application Priority Data

Aug. 1, 1988 [FR] France ................. 88 10375

[51] Int. Cl.⁵ .................. H01L 31/09; G01J 5/06
[52] U.S. Cl. ................... 250/349; 250/252.1; 250/332; 250/338.4; 250/370.08
[58] Field of Search ............ 250/252.1 A, 332, 349, 250/338.4, 370.08

[56] References Cited

U.S. PATENT DOCUMENTS 4,590,390  5/1986  Arques .................. 307/311

FOREIGN PATENT DOCUMENTS 19269 11/1980 European Pat. Off. .
68975  6/1982 European Pat. Off. .
54-55489 2/1979 Japan .................. 250/332
56-111382 3/1981 Japan .

OTHER PUBLICATIONS

S. Marshall, "Using Charge Injection on CCD Imaging Chips", Xerox Disclosure Journal, vol. 5, No. 5, Sep.-/Nov. 1980, p. 545.

Primary Examiner—Constantine Hannaher
Attorney, Agent, or Firm—Spensley Horn Jubas & Lubitz

[57] ABSTRACT

It comprises information photodetection means (2), which have N photodetectors (6), each photodetector being able to supply a current having an information-carrying component and a non-information carrying component, N being an integer at least equal to 1, reading means (4) for the thus detected information and which use for this purpose the current supplied by each photodetector, and N other regulatable means (22) respectively associated with the N photodetectors each other regulatable means being able to extract a regulatable intensity current from the current supplied by the associated photodetector prior to the use of said latter current by the reading means.

10 Claims, 3 Drawing Sheets

SYSTEM FOR THE DETECTION OF INFORMATION IN THE FORM OF ELECTROMAGNETIC RADIATION AND READING THE DETECTED INFORMATION

DESCRIPTION

The present invention relates to a system for the detection of information in the form of electromagnetic radiation and the reading of the detected information. It is more particularly applicable to the field of infrared imaging.

It is known that infrared imaging systems incorporate means for the photodetection of information in the form of infrared radiation and means for reading the detected information. The photodetection means are electrically coupled to the reading means and the present invention more particularly relates to the electrical coupling of said photodetection and reading means.

It is also known that infrared photodetection means can use several photodetectors, such as photovoltaic detectors, photodetectors or detectors of the MIS type (Metal-Insulator-Semi-conductor). These detectors convert infrared photons into electrons or holes and for this purpose use a substrate allowing an intrinsic or extrinsic detection of the photons (cf. the articles by G. A. WALTER et al published in "Laser Focus/Electro-optics", 1, Mar. 1986, pp. 108 to 118 and 2, Apr. 1986, pp. 86 to 96). In general terms, all these detectors can be looked upon as current photogenerators, which are sensitive to the photons of a particular wavelength.

For "reading" these detectors, numerous methods are also available, depending on whether it is wished to read a single photodetector a strip or array of photodetectors, or even a bidimensional array of photodetectors.

As a function of the detector type used, said detectors can be read in current, voltage or charge. All the known methods use a final conversion into voltage, so as to have a signal on a low impedance line satisfying the processing requirements of said signal (display, detection of thresholds, objects, spectral signature, velocity, etc).

Some of the reading methods are referred to in article (3) by K. CHOW et al entitled "Hybrid Infrared focal plane arrays" and published in IEEE Transactions on Electron Devices, Vol.ED 29, No. 1, Jan. 1982, in document (4) M. A. KEENAN et al, R. A. BALLINGAL et al, T. W. RIDLER, "Advanced infrared detectors and systems", IEEE London, 3-5 June 1986, Conference publication No.263 and in the article (5) of MR. KRUER et al, published in Optical Engineering March 1987, vol. 26, No. 3, pp. 182 to 190.

One of the major problems associated with infrared detection is that of reading high currents supplied by the photodetectors. Situations leading to high detection currents are not infrequently encountered. For example, reference is made to large wavelength detection, detection on a highly emissive radiation background and detection using photodetectors at an intermediate temperature and therefore having a high thermal current component. Intermediate temperature is understood to mean an operating temperature of the photodetector such that the dark current (thermal current) component of the photodetectors is not negligible compared with the photon component.

Excessively high current components and often not carrying useful information lead to a problem of the reading circuits becoming saturated. Various solutions can be used for solving this problem. Reference is e.g. made in the case of the use of a charge couple device CCD for reading and multiplexing, solutions using gate coupling and solutions using source coupling and processing of the signal at the reading circuit, such as "skimming" and/or partitioning, cf. article (3).

However, these known methods requiring devices fitted in the reading circuit, suffer from disadvantages. More particularly, in the case of gate coupling, the necessary electronics must be complex (preamplifier with higher resistive charges, cf. article (3)) and the problem of linearity associated with this reading mode. This linearity problem then occurs in connection with the signal processing electronics at the reading device output. In the case of source coupling in a circuit produced on a silicon substrate, solutions of the skimming and partitioning type do not make it possible to completely eliminate the saturation of the silicon circuit, because all the charges (charges corresponding to the radiation background and to the signal) must be injected into the silicon reading circuit (cf. article (3)).

This saturation problem will now be illustrated by an example limited to an infrared detection device and to a reading circuit produced on a silicon substrate. The corresponding system, which is known from article (3), is shown diagrammatically and partially in FIG. 1. Thus, this system comprises means 2 for the photodetection of information in the form of infrared radiation and means 4 for reading the thus detected information. These reading means 4 are electrically coupled to the photodetection means 2.

These photodetection means incorporate at least one photovoltaic infrared photodetector 6, i.e. an infrared photodiode, e.g. of the N on P type. The reading means 4 incorporate an input stage 8 constituted by a N channel MOS transistor. This transistor is produced on a P type silicon substrate 10 and comprises a N type source 12, a gate 14 and a storage capacity 16 serving as a virtual drain. This capacity 16 comprises a silica layer 18 constituting a dielectric and placed on the surface of substrate 10. Layer 18 is surmounted by an electrode 20 raised, by means of an appropriate source 17, to a positive potential compared with earth or ground. The substrate 10 is earthed or grounded. The photodetector 6 is source coupled to the transistor 8. The cathode of the photodiode forming the photodetector 6 is earthed or grounded and its anode electrically connected to the source 12 of transistor 8.

Through raising electrode 20 of capacity 16 to a positive potential brings about the disappearance of the majority carriers (holes) of substrate 10 beneath silica layer 18.

When photodetector 6 receives infrared radiation, it supplies an electron current I to the source 12 of the polarization transistor 8 and at the end of an integration time ti, a charge Q equal to I.ti is accumulated beneath the storage capacity 16. This charge is then converted into a voltage by any appropriate, not shown means. Such a voltage can be used on a low impedance line.

Obviously and as is diagrammatically shown in FIG. 1, the photodetection means 2 can comprise several instead of one photodiode 6. In this case, each photodiode is source coupled to a polarization transistor like transistor 8. All the polarization transistors, which then constitute the input stage of the reading means associated with the plurality of photodiodes, can be integrated onto the type P silicon substrate 10 and source 17 can be common to all the transistors.

Figure 2:
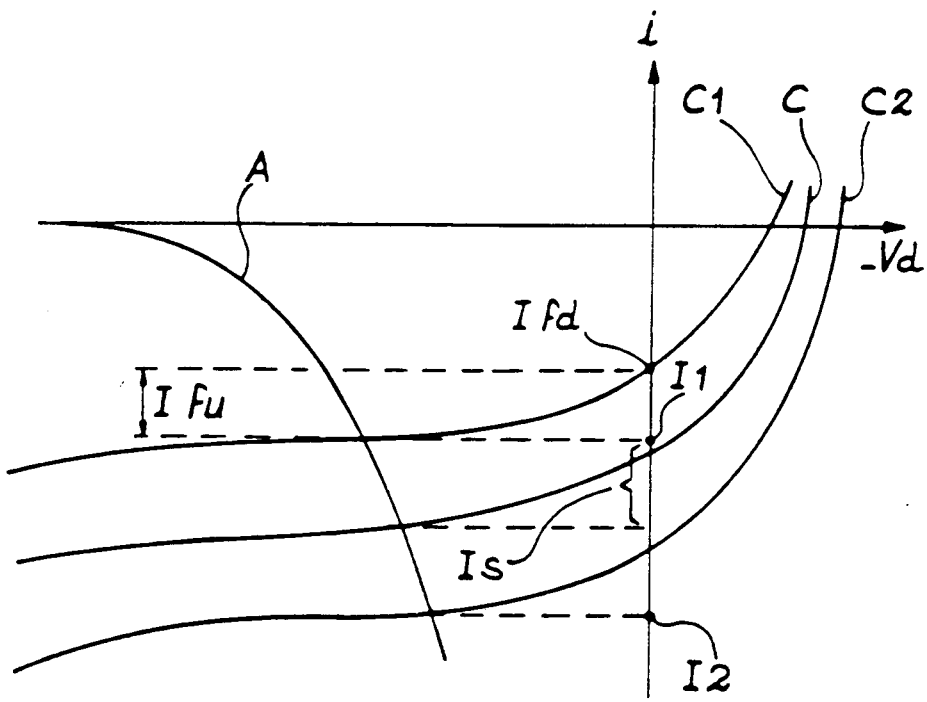

On returning to the operation of the system described relative to FIG. 1, FIG. 2 shows the characteristic A of polarization or reading transistor 8 under saturation operating conditions. It is assumed that the users of the system shown in FIG. 1 are only interested in the signal supplied by each photodetector 6 in a certain range of infrared photon fluxes. The flux $\phi$ of infrared photons received by photodetector 6 can vary between a minimum value $\phi 1$ and a maximum value $\phi 2$. FIG. 2 also shows the characteristic C1 of photodetector 6 exposed to the minimum flux $\phi 1$ and the characteristic C2 of said photodetector 6 exposed to the maximum flux $\phi 2$.

The current intensities i are plotted on the ordinate and on the abscissa is plotted the potential Vd of the anode of photodetector 6. Over a period of time, characteristic C of photodetector 6, exposed to the flux $\phi$, varies between C1 and C2.

Photodetector 6, exposed to flux $\phi 1$ (respectively $\phi 2$) produces a current I1 (respectively I2) constituting the ordinate of the intersection point of characteristic A and characteristic C1 (respectively C2) or the static operation point of the system exposed to flux $\phi 1$ (respectively $\varphi 2$).

When photodetector 6 is e.g. exposed to flux $\phi 1$, it consequently produces the current I1 at the corresponding static operating point and this current, which is an electron current in the considered case, in injected into the polarization transistor 8. At the end of the integration time ti, a charge Q1 equal to I1.ti is stored beneath capacity 16. This charge is an image of flux $\phi 1$ seen by the photodetector during time ti. Therefore capacity 16 serves as a virtual drain for the transistor 8.

FIG. 2 shows that the total current I injected into transistor 8 has various components, namely:

a component not carrying information and which can be broken down into a component Ifd corresponding to the intersection of characteristic C1 and the axis of the ordinates, said component Ifd being e.g. imposed by the radiation background, which is inter alia due to the minimua flux $\phi 1$; and another component Ifu, which is linked with the operating temperature of the photodetector (saturation current), as well as the leakage current imposed by the leakage impedance of the photodetector, Ifu being equal to I1 less Ifd;

a component carrying sought information (useful component) which is designated Is and is equal, for flux $\phi$, to the ordinate of the intersection of characteristics A and C, less I1.

Thus, Is is liable to vary between 0 and 12 - I1. Moreover, the total injected current I is the sum of Ifd, Ifu and Is. It is this current I which conditions the maximum integration time $ti_{max}$ acceptable for not saturating the capacities serving as the virtual drain in the input stage of reading means 4.

The present invention aims at solving the aforementioned saturation problem by only supplying the useful information to the reading means of an infrared imaging system and more generally a system for the detection of information in the form of electromagnetic radiation and of reading the detected information. Thus, in the embodiment illustrated in FIG. 1, the present invention solves the problem of only injecting useful component Is beneath the storage capacity 16.

To this end, according to the present invention, the useless component of the current (component not carrying information) is diverted prior to the injection of this current into the reading means without any deterioration to the apparent impedance of the photodetector or photodetectors and which conditions the satisfactory operation of the system.

More specifically, the present invention relates to a system for the detection of information in the form of electromagnetic radiation and reading the detected information, said system comprising information photodetection means, which have N photodetectors, each photodetector being able to supply a current having an information carrier component and a component not carrying information, N being an integer at least equal to 1 and means for reading the information detected in this way and using for this purpose the current supplied by each photodetector and N other regulatable means respectively associated with the N photodetectors, each other regulatable means being able to remove a current of regulatable intensity from the current supplied by the associated photodetector prior to the use of the latter current by the reading means.

With the aid of an appropriate regulation of each other regulatable means, it can be seen that it is possible to remove from the current supplied by the photodetector associated with said other regulatable means the component not carrying the information prior to the use, by the reading means, of the current supplied by said photodetector.

According to a special embodiment of the system according to the invention, N exceeds 1 and each other regulatable means is also able to store, when the photodetectors are exposed to the same reference electromagnetic radiation, and electric correction information, linked with said reference information and enabling each of the regulatable means, when they are subject to the information in the form of electromagnetic radiation, to produce an electric correction current, which is a function of the stored electric correction information and which is removed from the current supplied by the photodetector while the latter receives the information in the form of electromagnetic radiation and the electric correction information remains stored.

As will become more readily apparent hereinafter, this special embodiment makes it possible to solve in an identical manner the problem of eliminating noise known as fixed pattern noise and which is produced by the N photodetectors, whereas the known procedures require a complicated digital processing of the signals supplied by the system (particularly in the case of an infrared imaging system).

In a special embodiment of the system according to the invention, each other regulatable means has a regulatable current generator of charge carriers of the opposite type to that of the charge carriers of the current supplied by the associated photodetector, the intensity of the current supplied by said regulatable detector consequently being of opposite sign to that of the current supplied by said associated photodetector.

This makes it possible to regulate each current generator in such a way that the absolute value of the intensity of the current which it is able to supply is equal to the absolute value of the intensity of said non-information carrying component, in order to extract the latter from the current supplied by the photodetector in question.

Preferably, each regulatable current generator comprises a transistor having a control electrode connected in parallel with the associated photodetector and able to supply said charge carrier current of opposite type, said transistor being regulated by raising its control electrode to a suitable potential.

Thus, a transistor can be controlled via a single electric conductor and it is therefore easier to control a transistor than e.g. a phototransistor or a photodiode, whose control requires the use of light.

In the present invention, the transistor can be a MOS transistor, the control electrode then being the gate electrode thereof. In this case and on considering the special embodiment of the system according to the invention making it possible to eliminate the fixed pattern noise referred to hereinbefore, the reading means have an input stage receiving the currents supplied by each photodetector, the gate electrode of the MOS transistor being connected to said input stage via a switch, which enables the gate capacity of the MOS transistor to store the electric correction information when the switch is closed and the associated photodetector is exposed to the reference electromagnetic radiation. The switch can be controlled by a periodic electric signal permitting the periodic closing of said switch.

The switch can e.g. be constituted by a transistor. The system according to the invention can also comprise N other transistors respectively associated with the photodetectors, each other transistor being connected in such a way as to form the switch associated with the photodetector corresponding to said other transistor.

Finally, as stated hereinbefore, the information can be in the form of infrared radiation. However, the present invention is not limited to such a radiation and can be adapted to the detection of visible, ultraviolet, X or gamma radiation in exemplified manner and as will be shown hereinafter.

The invention is described in greater detail hereinafter relative to non-limitative embodiments and the attached drawings, wherein show:

FIG. 1 a partial, diagrammatic view of a known system for the detection of information and the reading of the detected information described hereinbefore.

FIG. 2 characteristics of said system having already been described.

Figure 3:
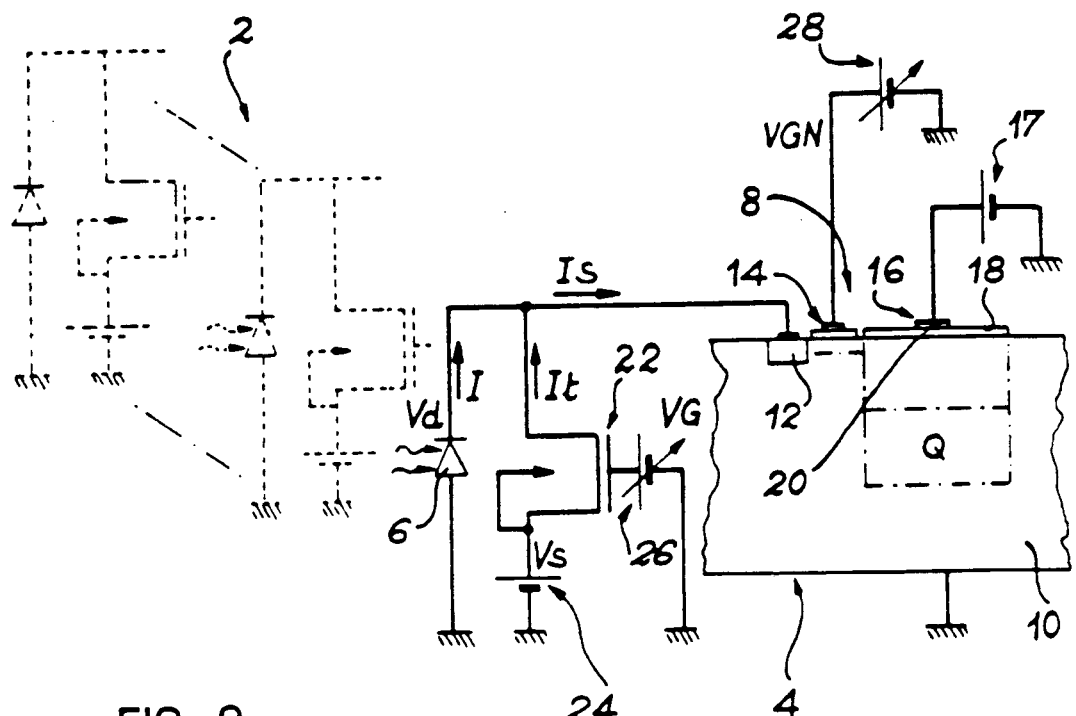

FIG. 3 a partial, diagrammatic view of a special embodiment of the system according to the invention.

Figure 4:
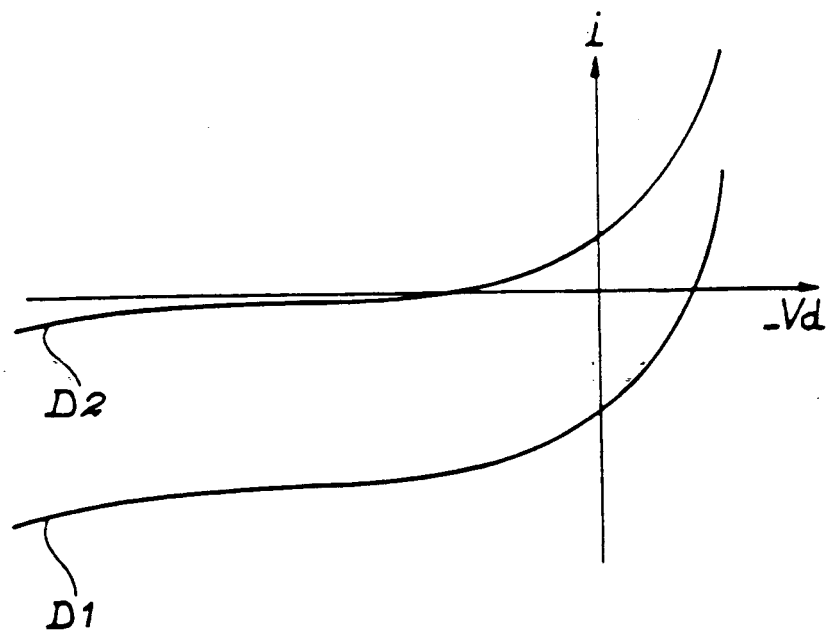

FIG. 4 the interest of the system shown in FIG. 3 by means of the current - voltage characteristics.

Figure 5:
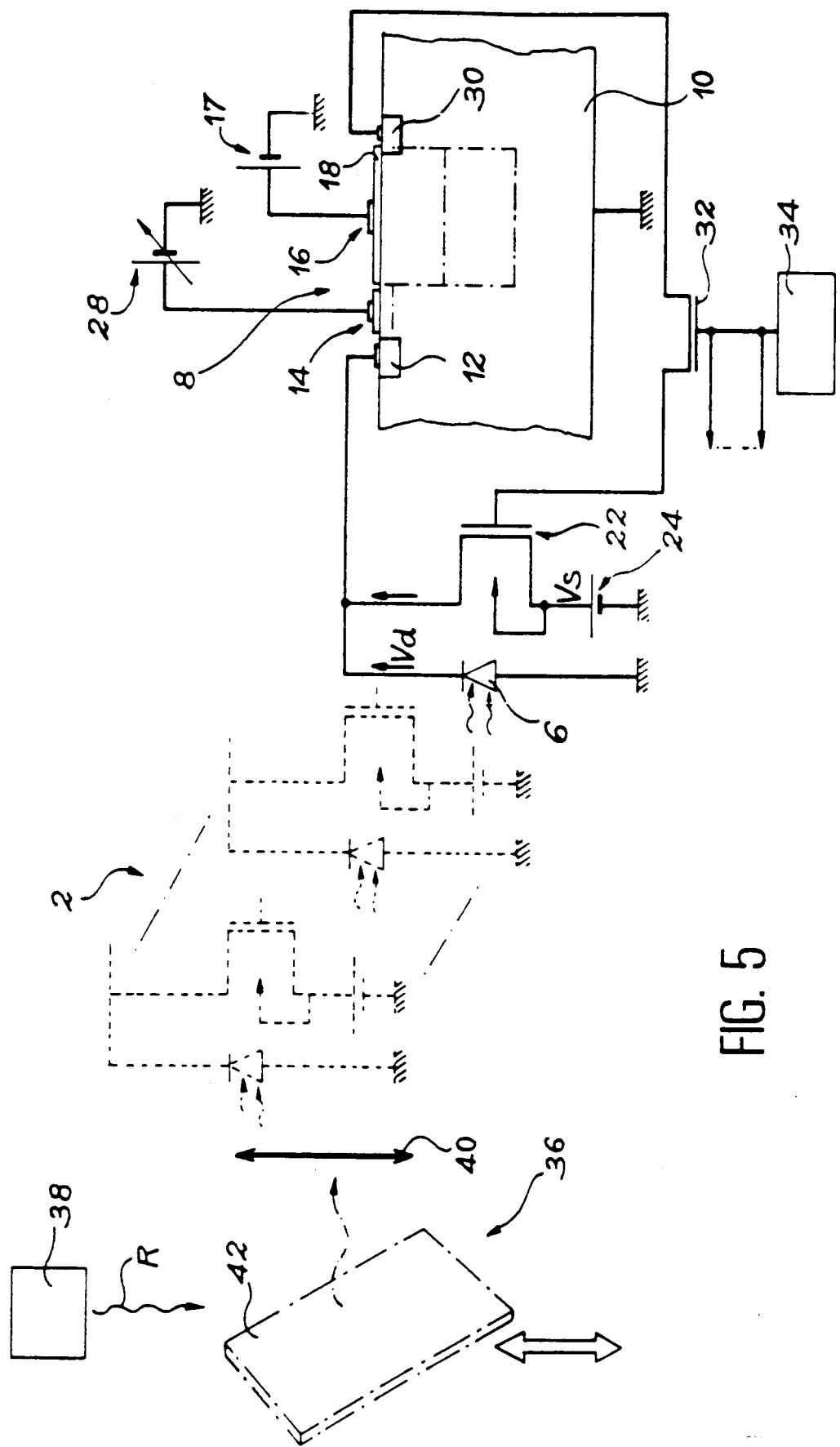

FIG. 5 a partial, diagrammatic view of another system according to the invention.

FIG. 3 diagrammatically and partially shows a special embodiment of the system according to the invention. The system shown in FIG. 3 results from a modification of the system shown in FIG. 1, so as to only inject the information carrier component Is beneath the storage capacity 16. This modification makes it possible to divert the non-information carrying component of current I supplied by each photodetector 6 prior to the injection of said current into the input stage 8 of the reading means 4, without any deterioration to the apparent impedance of photodetector or photodetectors.

The modification is as follows. With each photodetector 6 is associated a P channel, MOS transistor 22, which is connected in parallel with the associated photodetector. The drain of transistor 22 is electrically connected to the anode of the associated detection diode 6. The source of transistor 22 is raised to a fixed positive potential VS by means of an appropriate source 24. The gate of transistor 22 is raised to a positive potential VG regulatable by means of an appropriate regulatable source 26. FIG. 3 also shows the socket of the substrate of transistor 22 and which is also raised to potential VS. Transistor 22 is used under saturated operating conditions by controlling its gate-source voltage, i.e. VG - VS, by regulating source 26. Thus, transistor 22 behaves in the same way as a current generator controlled by VG - VS and has a very high dynamic impedance (fixed by the Eurly voltage of transistor 22), which is equal to the drain - source impedance of transistor 22 (typically a few gigaohms in saturation operation).

Transistor 22, which is in parallel with photodetector 6, consequently only leads to little or no reduction in the dynamic impedance of said photodetector 6, when the impedance does not exceed these few gigaohms.

FIG. 3 also shows that the gate 14 of transistor 8 is raised to a positive potential VGN regulatable by means of an appropriate regulatable source 28, so as to be able to regulate the operating point of the system (which also applies to the system of FIG. 1).

When a plurality of photodetectors is provided, it is possible to use a single source 24 and a single source 26 for all the transistors 22 associated with these photodetectors and a single source 28 for all the transistors 8 also associated with said photodetectors.

Obviously, instead of using a regulatable source 26 and a source 24 supplying a fixed potential VS, it would be possible to use a regulatable source 24 and a source 26 supplying a fixed potential VG.

Moreover, the addition of each transistor 22 to the system shown in FIG. 1 can be brought about by using CMOS technology. Each transistor 8 is produced on a P-type silicon plate or wafer and on the latter are also produced recesses, whose number is equal to that of the photodetector 6 and a N-type substrate is formed on each recess. A transistor 22 is produced on each thus formed substrate. Obviously, instead of using monolithic technology, it would be possible to produce each transistor 8 on the same substrate and each transistor 22 on the same substrate, but differing from the preceding substrate, followed by the production of the necessary interconnections.

The system shown in FIG. 3 operates in the following way. The P-channel MOS transistor 22 behaves in the same way as a current generator of holes It. These holes recombine with the electrons supplied by the detecting diode 6. The resulting current Is injected into the N-channel MOS transistor 8 is therefore the algebraic sum of these two currents, whose intensities I and It have opposite signs. It is therefore possible to adjust this sum by acting on the regulatable source 26, so as to only inject into transistor 8 the information - carrying component Is. For this purpose, it is e.g. possible to place the system in the dark (corresponding to $\phi 1$) and regulate VG until the component not carrying information Ifd + Ifu is canceled out, It then being equal to the opposite of said non-information carrying component.

It is pointed out that the assembly of the P-channel MOS transistor 22 makes it possible to render the latter insensitive to variations in its drain potential (saturated operating conditions), said potential evolving slightly as a function of the flux $\phi$ received by the detecting diode 6.

FIG. 4 shows the current (i)-voltage (vd) characteristic of the photodetector 6 - transistor 22 means, for a given infrared radiation flux $\phi$, when VG is equal to VS (zero current in transistor 22). This characteristic is designated D1 in FIG. 4. The latter also shows the characteristic of the means in question for the same flux $\phi$, but when the potential VG is below V. The latter characteristic is designated D2 in FIG. 4, which therefore shows the effect of transistor 22. Thus, the appropriately regulated transistor 22 permits a true current "skimming", which obviates the saturation problem referred to hereinbefore.

The system shown in FIG. 3 has two major advantages. Firstly all the storage dynamics under capacity 16 are only used for the information carrying component, which increases the sensitivity of the system. The latter has a better volt response to each infrared photon received. Moreover, for a given storage capacity, it is possible to increase the integration time of the system (because the total current is reduced), which has an immediate effect on the noise of said system. Thus, it is known that the integration time ti fixes the electronic pass band of the system to an ideal pass band of cutoff frequency fc=0.5/ti.

In view of the fact that transistor 22 operates in parallel with photodetector 6, the spectral densities of the noise current of these two components are added quadratically and are injected into the reading means. In the case where the component not carrying information is large compared with the information-carrying component, it is necessary to wait for an increase in the spectral density of the noise current of approximately $2^{\frac{1}{2}}$ if the noise levels of transistor 22 and photodiode 6 are identical. The signal-to-noise ratio at the output of the system is proportional to $ti^{\frac{1}{2}}$, so that this deterioration is compensated by merely doubling the initial time ti (without current skimming). Current skimming potentially permits a much larger increase of ti and the system using said current skimming is consequently better than the prior art system (FIG. 1).

Current skimming according to the present invention has been described in the particular case of a N on P photovoltaic infrared detector "read" with source coupling by a N-channel MOS transistor. However, the invention is very general and can be adapted to numerous different types of detectors and reading circuits. For example, reference can be made to :
(a) for detectors:
 homojunction or heterojunction photovoltaic detectors,
 intrinsic or extrinsic photoconductor detectors,
 CID, XCED or IBC detectors (cf. article (1), IBC detectors being currently known as BIB or BIBIB detectors,
 phototransistor detectors;
(b) for reading circuits:
 CCD circuits, cf. article (3),
 MOS circuit, cf. document (4),
 current - voltage or charge - voltage preamplifiers,
 DRO reading circuit, cf. document (6) "preliminary measurement of very low dark currents in MLA/SWIR HgCdTe/DRO arrays", B. T. YANG, SBCR IR Technology Workshop, Aug. 13-14 1985 at NASA/Ames.

Moreover, current skimming has been described in the case of infrared detection, but its principle applies for photon detection in general, no matter what the spectral range (visible, ultraviolet, X, gamma, etc.). For the detection of a X or gamma radiation, it is merely necessary to couple to a photoscintillator able to detect the X or gamma radiation, an appropriate photodetector which will supply the current I.

Finally, the operation of the current generator formed by transistor 22 can be ensured by other devices. It could e.g. be realized by using a phototransistor or a photodiode for visible or other radiation. However, the MOS or other type of transistor constitutes a preferred means for fulfilling this function, because its control can be assured electrically with the aid of a single electrical conductor (for regulating VG with VS fixed, or, as a variant, for regulating VS with vG fixed, as stated hereinbefore).

A transistor is also very suitable for producing array-type structures, because the electrical control of the current skimming can be common to all points of such an array.

It should also be noted that the embodiment according to the invention uses conventional means for the interconnection of the integrated circuits.

FIG. 5 diagrammatically and partially shows another special embodiment of the system according to the invention. The system shown in FIG. 5 permits an auto-calibration of an array of photodetectors 2, which are "read" in source coupling by a silicon circuit (cf. FIG. 3).

In the infrared detection devices of the array type, it is known that one of the problems to be solved is the dispersion of the behavior of the different photodetectors. Due to the inevitable imperfections of the production technology, the photodetectors illuminated by a uniform photon flux supply different currents. This dispersion induces a noise known as fixed pattern noise, which can be corrected by calibrating the display.

One known calibration method consists of shooting under an illumination serving as a correction reference, storing the signal of each of the elementary points (photodetectors) and subtracting said signal from the signal supplied by the photodetector in question during shooting. For this purpose, the reference signal is digitized at the display output and stored in digital form and is then digitally subtracted from the also digitized signal, which is supplied by each photodetector during shooting operations.

The present invention makes it possible to envisage an elementary structure having said correction function, in analog instead of digital form.

FIG. 5 diagrammatically and partly illustrates an infrared imaging system having such an analog correction and even auto-correction function. The system shown in FIG. 5 results from a modification thereof shown in FIG. 3. The gate of each transistor 22 is electrically connected to a N-type zone 30 implanted in a P-type substrate 10 and located in the vicinity of the storage capacity 16 corresponding to said transistor 22 instead of to a source 26. Layer 30 is a means (in the present case a contact socket) permitting the reading of the surface potential beneath layer 18. The connection between the gate of transistor 22 and the associated zone 30 takes place by means of a switch, e.g. constituted by a MOS transistor 32, which makes it possible to raise the gate of transistor 22 to the same potential as zone 30 when the switch in question is closed. The opening or closing of the switch is controlled by a pulsed signal. For this purpose, the source of transistor 32 is electrically connected to the gate of transistor 22 and the drain of transistor 32 is electrically connected to zone 30. Obviously, these source and drain connections of transistor 32 can be reversed. Moreover, the gate of transistor 32 is connected to a voltage source 34 making it possible to periodically raise the gate of transistor 32 to a potential permitting the closing of the switch, the latter remaining open for the rest of the time. The same source 34 can be used for controlling all the transistors 32 (which are respectively associated with photodiode 6).

In addition, the system shown in FIG. 5 comprises means 36 making it possible to supply the same infrared reference radiation R to all the photodetectors 6. These means 36 e.g. consist of an infrared reference source 38 of uniform temperature, whose radiation is supplied, across the optics 40 of the system, to all the photodetectors 6, via a retractable infrared radiation reflector 42. Thus, when reflector 42 is placed infront of optics 40, the reference radiation is transmitted to all the photodetectors 6 and when the said reflector 42 is retracted, it is the infrared radiation which it is wished to detect and which reaches all these photodetectors.

In the case where the system is intended for the study of X, gamma or visible radiation, means 36 are replaced by retractable visible, X or gamma radiation production means.

The operation of the system shown in FIG. 5 is broken down into two phases, namely an initialization phase during which the photodetectors receive the reference photon flux and a shooting phase during which they receive the radiation to be studied.

During the initialization phase when the photodetectors receive the reference photon flux (mirror 42 being in the non-retracted position), each switch 32 is closed, each transistor 8 being normally polarized (i.e. the choice of the operating point of the system has been made beforehand) and each storage capacity 16 is conventionally initialized (i.e. raised to its nominal positive potential). No matter what the initial potential state of the gate of a transistor 22, said gate will then be balanced at a potential making it possible to cancel out the current in the corresponding reading transistor 8. Thus, the sought final state is obtained, namely a current skimming and this is in fact obtained in an automatic manner. The reference current of each detection photodiode 6 is canceled out by the opposite current supplied by the P-channel MOS transistor 22 corresponding to said photodiode.

In the shooting phase, each switch 32 is again open, the capacity of the gate of transistor 22 corresponding thereto retaining its memory the potential acquired during the initialization phase. Thus, during said shooting phase, only an increase of the current of the associated photodetector and carrying the useful information is injected into the corresponding transistor 8 and "measured" in the storage capacity 16 of the latter.

In practice, in the shooting phase, the capacity of the gate of transistor 22 will progressively lose its potential information, stored during the initialization phase, with a time constant which generally has a value well above the reference shooting period.

Thus, the addition of a small number of components 22 and 32 integratable with the reading circuit of each elementary point of the multidetector display shown in FIG. 5 gives the display two new and very important functions, namely that of suppressing the current component not carrying information (offset current) and the function of eliminating the fixed pattern noise of the photodetectors. Thus, auto-correction of the system is brought about by merely controlling transistor 32.

We claim:

1. System for the detection of information in the form of electromagnetic radiation and reading the detected information, said system comprising information photodetection means, which have N photodetectors, each photodetector being able to supply a current having an information carrier component and a component not carrying information, N being an integer at least equal to 1, and means for reading the information detected in this way and using for this purpose the current supplied by each photodetector and N other regulatable means respectively associated with the N photodetectors, each other regulatable means being able to remove a current of regulatable intensity from the current supplied by the associated photodetector prior to the use of the latter current by the reading means so as to remove the component not carrying information from the current supplied by the respective photodetector.

2. System according to claim 1, wherein N exceeds 1 and each other regulatable means is also able to store, when the photodetectors are exposed to the same reference electromagnetic radiation, an electric correction information, linked with said reference radiation and enabling each of the regulatable means, when they are subject to the information in the form of electromagnetic radiation, to produce an electric correction current, which is a function of the stored electric correction information and which is removed from the current supplied by the photodetector as long as the latter receives the information in the form of electromagnetic radiation and the electric correction information remains stored.

3. System according to claim 2, wherein the transistor is a MOS transistor and the control electrode is the gate electrode of said transistor and wherein the reading means have an input stage receiving the current supplied by each photodetector and the gate electrode of the MOS transistor is connected to said input stage via a switch, which enables the gate capacity of the MOS transistor to store the electric correction information when the switch is closed and the associated photodetector is subject to the reference electromagnetic radiation.

4. System according to claim 3, wherein the switch is controlled by a periodic electric signal permitting the periodic closing of said switch.

5. System according to claim 3, said system also comprising N other transistors, which are respectively associated with the photodetectors, each other transistor being connected so as to form the switch associated with the photodetector corresponding to said other transistor.

6. System according to claim 1, wherein each other regulatable means has a regulatable current generator for generating a current of charge carriers of the type opposite to that of the charge carriers of the current supplied by the associated photodetector, the intensity of the current by said regulatable generator consequently being of opposite sign to that of the current supplied by the associated photodetector.

7. System according to claim 6, wherein each regulatable current generator comprises a transistor having a control electrode, which is connected in parallel with said associated photodetector and which is able to supply the opposite type of charge carrier current, said transistor being regulated by raising its control electrode to an appropriate potential.

8. System according to claim 7, wherein the transistor is a MOS transistor and the control electrode is the gate electrode of said transistor.

9. System according to claim 4, wherein the transistor is a MOS transistor and the control electrode is the gate electrode of said transistor and wherein the reading means have an input stage receiving the current supplied by each photodetector and the gate electrode of the MOS transistor is connected to said input stage via a switch, which enables the gate capacity of the MOS transistor to store the electric correction information when the switch is closed and the associated photodetector is subject to the reference electromagnetic radiation.

10. System according to claim 1, wherein the information is in the form of infrared radiation.

* * * * *